United States Patent [19]
Phillips

[11] Patent Number: 4,866,683
[45] Date of Patent: Sep. 12, 1989

[54] INTEGRATED ACOUSTIC RECEIVER OR PROJECTOR

[75] Inventor: Morris J. Phillips, Everett, Wash.

[73] Assignee: Honeywell, Inc., Minneapolis, Minn.

[21] Appl. No.: 197,875

[22] Filed: May 24, 1988

[51] Int. Cl.⁴ .................................... H04R 17/00
[52] U.S. Cl. ............................... 367/157; 367/159; 367/155; 310/334; 29/25.35; 381/190
[58] Field of Search ............. 367/157, 159, 165, 173, 367/155; 310/334, 337; 29/25, 35; 73/DIG. 4; 128/660.01, 24 A; 381/190

[56] References Cited

U.S. PATENT DOCUMENTS

| 2,672,590 | 3/1950 | McSkimmin | 333/30 |
| 2,709,147 | 9/1951 | Ziegler | 154/128 |
| 2,859,415 | 11/1958 | Fagen | 333/30 |
| 3,616,529 | 8/1968 | Iding | 29/594 |
| 4,228,532 | 10/1980 | Sims | 367/159 |
| 4,404,489 | 9/1983 | Larson, III et al. | 310/334 |
| 4,445,256 | 5/1984 | Huguenin et al. | 29/25.35 |
| 4,479,035 | 10/1984 | Philliphar | 179/115.5 |
| 4,545,041 | 10/1985 | Tims et al. | 367/157 |
| 4,594,698 | 5/1986 | Hefer | 367/188 |
| 4,638,468 | 1/1987 | Francis | 367/157 |
| 4,700,100 | 10/1987 | Congdon et al. | 310/322 |
| 4,747,192 | 5/1988 | Rokurota | 310/334 |
| 4,768,173 | 8/1988 | Gautier et al. | 367/159 |

FOREIGN PATENT DOCUMENTS

1008554 4/1977 Canada .

Primary Examiner—Deborah L. Kyle
Assistant Examiner—J. Woodrow Eldred
Attorney, Agent, or Firm—Whitham & Marhoefer

[57] ABSTRACT

An acoustic element assembly used in underwater receivers and projectors comprises two piezoelectric elements bonded to opposite sides of a hybrid circuit substrate (16). The hybrid circuit substrate (16) includes radial slots (32, 34, and 36) which have been cut therethrough. The radial slots (32, 34, and 36) permit a center section (31) to move bidirectionally. Integral microelectronic circuitry which makes up the receiver or projector is fabricated in the center section (31) on both sides of an alumina ceramic disk (30) using thick and thin film technologies. Piezoelectric cylinders (12 and 14) or piezoelectric hemispheres (22 and 24) are bonded to opposite sides of disk (30) with both conductive and non-conductive bonding materials. The microelectronic circuitry is electrically connected to said cylinders or hemispheres (12, 14, 22, and 24) by conductive lines (44). The acoustic element assembly may be formed by automated techniques and does not require any internal wiring.

15 Claims, 5 Drawing Sheets

INTEGRATED ACOUSTIC RECEIVER OR PROJECTOR

BACKGROUND OF THE INVENTION

1. Field of the Invention

The present invention is generally related to a packaging design for a hydrophone which uses a ceramic substrate with multiple layers of microelectronic circuitry formed thereon to support and connect piezoelectric elements and, more particularly, to a hydrophone which integrates a high gain, frequency compensated, low noise amplifier or other micro-electronics with the acoustic elements without impinging on any required acoustical parameters and which can withstand the crushing pressures of deep water.

2. Description of the Prior Art

Hydrophones, which are underwater sonic receivers, as well as projectors, which are underwater sound transmitting devices, have a wide range of applications. For example, underwater receivers and projectors have been used for seismic exploration, depth finding, navigation, commercial fishing, and for detecting noise from submarines.

Canadian Pat. No. 1,008,554 discloses a buoyant hydrophone for submarine detection which includes a pair of hollow cylindrical transducers formed of piezoelectric ceramic material. The piezo cylinders are symmetrically positioned on opposite sides of a central support made of plastic. The piezo cylinders are radially poled with one cylinder poled positive on its outer surface and negative on its inner surface and the other cylinder being oppositely poled, i.e., negative on its outer surface and positive on its inner surface. Silver electrodes on the inner surfaces of the piezo cylinders may be connected by internal leads to a pre-amplifier that is mounted on the center portion of the central support. Plastic hemispherical shells are positioned on the outer sidewalls of the piezo cylinders for adding strength to the assembled, neutrally buoyant hydrophone. The hydrophone is used in a towed array as opposed to a submerged array.

The Canadian patent refers to the pre-amplifier as an "integral pre-amplifier", but what is meant by this reference is merely that the pre-amplifier is attached to a central portion inside the hydrophone structure. The pre-amplifier is not formed as a unit with the other parts which comprise the hydrophone's structure. It is an add on part which must be separately hand wired to the silver electrodes on the piezo cylinders. Moreover, the specification indicates the pre-amplifier may or may not be required. In addition, the hydrophone is not optimized for acoustic properties.

U.S. Pat. No. 4,228,532 to Sims shows a piezoelectric transducer used in a towed hydrophone array. Two piezoelectric hemispheres and a piezoelectric cylinder are connected together by non-conductive epoxy to form a symmetrical arrangement. The device is not useful at high pressures due to a lack of internal pressure compensation.

U.S. Pat. No. 4,545,041 to Tims et al discloses a shock hardened hydrophone comprising a sensor electrically connected to a low output-impedance pre-amplifier by a circuit board. The sensor includes two metal cups, each cup with a piezoelectric ceramic disk positioned therein for generating a potential difference between the first and second surfaces of the disk. The cups are bolted together with a circuit board positioned between them. A first electrode positioned on both sides of the circuit board is in pressure contact with the first surface of each disk. A wire connects one of the cups to a second electrode positioned on a side of the circuit board. A pre-amplifier is mounted on the circuit board and has input leads soldered to the two electrodes. The input to the pre-amplifier is the voltage difference between the first and second electrodes. The entire sensor-circuitboard-pre-amplifier assembly is potted in polyurethane for waterproofing and bonded to a polyurethane jacketed cable.

Tims et al do not show an integral pre-amplifier in that the pre-amplifiers components are not mounted on the circuit board. The pre-amplifier is placed in a separate pressure housing which is then wired to the circuit board. The circuit board only partially interconnects the acoustic elements. The clamped together configuration of the sensor results in the direct electrical connection of the disks to the metal cups on one surface and to the first electrode on the circuitboard on the other surface. However, the connection between the cups and the second electrode must be accomplished by separate wiring.

There is no teaching in the prior art of an acoustic receiver or projector which includes micro-electronics integral with piezoelectric ceramic elements. There is no teaching in the prior art of using a ceramic substrate which includes micro-electronic circuitry formed thereon to support and connect piezoelectric elements for use in a very high pressure environment.

SUMMARY OF THE INVENTION

It is therefore an object of this invention to provide an acoustic receiver or projector wherein a ceramic, micro-electronic, multilayer circuit substrate is used to support and connect piezoelectric elements such that no wiring is required.

It is another object of this invention to provide a hydrophone having integral microelectronic circuitry integral with the acoustic elements.

It is another object of this invention to provide a method of building a very wide band receive hydrophone (from 1 Hertz (Hz) to 100 Hz), with very low self noise (below sea state 0), that can withstand very high water pressures (10,000 pounds per square inch (psi)).

It is yet another object of this invention to design a hydrophone which can be assembled by automated procedures.

According to the invention, the acoustic element assembly of the hydrophone comprises a circular hybrid device that is assembled as an integral part of a pair of piezoelectric cylinders or hemispheres. The hybrid device includes a circular alumina ceramic substrate material on which circuitry has been fabricated in the central region using standard thick and thin film techniques. Circuitry is positioned on both sides of the alumina ceramic substrate with through holes allowing electrical connections between the two sides. Other substrate materials and acoustic materials may be used where the substrate materials have low thermal expansion coefficients matched to the acoustic material utilized.

Bidirectional movement arcs are cut out of the circular alumina ceramic substrate by laser. The arcs allow for acoustical energy movement in the center section of the substrate. The arcs are spaced outside the circuitry in the center section of the alumina ceramic. A pair of piezoelectric cylinders or spheres are bonded to opposite sides of the alumina ceramic using both non-conductive bonding material and conductive bonding material. No mechanical fastening devices are required. The piezo cylinders are radially poled with one cylinder poled positive on its outer surface and negative on its inner surface and the other cylinder being oppositely poled, i.e., negative on its outer surface and positive on its inner surface. The piezoelectric elements are spaced outside the diameter of the bidirectional movement arcs. The non-conductive bonding material is preferably an epoxy having a thermal coefficient of expansion matched to that of the ceramic materials. The conductive bonding material is preferably silver epoxy or solder paste. The conductive bonding material is utilized only at specific locations to provide an electrical connection to the inside or outside surface of a piezoelectric element. Conductive bonding areas are linked to the circuitry in the center section of the alumina ceramic substrate by conductive lines which are formed using standard thick film techniques. Internal wiring to the acoustic elements is eliminated by the use of thick film conductive lines and conductive bonding material. A glass dielectric material insulates the conductive lines from the piezoelectric elements.

If piezoelectric cylinders are used, a ceramic pressure cover is placed over the circuitry in the center section of the alumina ceramic substrate. The pressure cover is joined to the substrate at a position inside the diameter of the bidirectional movement arcs by a material having a matching thermal coefficient of expansion. If piezoelectric hemispheres are used, no pressure cover is required; however, the spherical configuration, acoustically, cannot withstand as much pressure as the pressure compensated cylinder configuration and is therefore only viable at lesser depths. The thick and thin film micro-electronic circuitry within the small center section can provide data processing and may include a complex amplifier and signal conditioner. The design of the hydrophone allows for automated fabrication.

BRIEF DESCRIPTION OF THE DRAWINGS

The foregoing and other objects, aspects and advantages of the invention will be better understood from the following detailed description of the preferred embodiment of the invention with reference to the accompanying drawings, in which.

DETAILED DESCRIPTION OF THE PREFERRED EMBODIMENT OF THE INVENTION

Figures 1, 2, 3, 4:
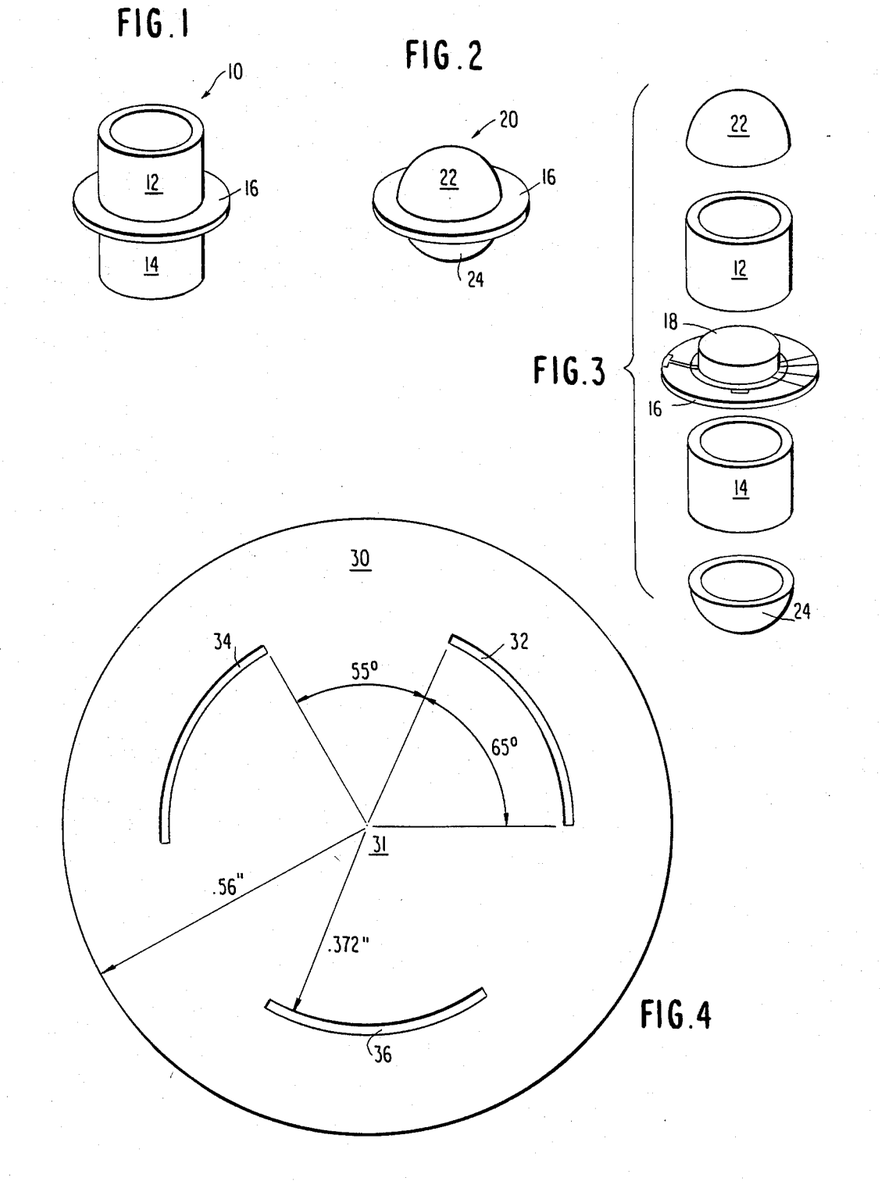
FIG. 1 is a perspective view of a first inventive hydrophone configuration showing a pair of cylinders joined to opposite sides of a hybrid circuit substrate.
FIG. 2 is a perspective view of a second inventive hydrophone configuration showing a pair of hemispheres joined to opposite sides of a hybrid circuit substrate.
FIG. 3 is perspective view of the components used in both configurations.
FIG. 4 is a plan view of an alumina ceramic substrate showing the relative position of the movement arc cuts.

Referring now to the drawings and, more particularly, to FIGS. 1 and 2 which show two configurations for a hydrophone acoustic element assembly 10 and 20. In FIG. 1, two piezoelectric ceramic cylinders 12 and 14 are joined to opposite sides of a hybrid circuit substrate 16. The cylinders 12 and 14 are preferably 0.5 inches high, and 1.0 inches thick. In FIG. 2, two piezoelectric ceramic hemispheres 22 and 24 are joined to opposite sides of a hybrid circuit substrate 16. The hemispheres 22 and 24 are preferably 0.5 inches in radius, and 0.5 inches thick. In both configurations 10 and 20 no mechanical fasteners are required.

FIG. 3 is a perspective view of the components used for both configurations 10 and 20. If the cylinder configuration 10 is constructed, a pressure cover 18 machined in the form of a cap must be joined to the hybrid circuit substrate 16 to cover and protect the micro-electronic circuitry present on the hybrid circuit substrate 16. If micro-electronic circuitry is present on both sides of the hybrid circuit substrate 16, then two pressure covers 18 will be required to cover and protect both sides of the hybrid circuit substrate 16. It has been found that with machined ceramic covers that are approximately 0.25 inches thick, the hydrophone can withstand pressures as a high as 10,000 psi. In the spherical configuration 20, the hemispheres 22 and 24 act as pressure covers; however, with configuration 20, internal pressure compensation becomes a problem acoustically at high pressures.

FIG. 4 shows a substrate disk 30 which serves as the substrate on which micro-electronic circuitry will be formed and to which acoustic elements will be joined. When micro-electronic circuitry is fabricated on substrate disk 30 using standard thick film and thin film techniques, it becomes the hybrid circuit substrate 16 that integrates the microelectronic circuitry with the acoustic elements. The substrate disk is rigid and is preferably comprised of alumina ceramic which is 0.024 inches thick; however, other substrates which have a thermal coefficient of expansion that is matched to that of the acoustic elements could be used. In a preferred embodiment of the invention, the disk 30 has a radius of approximately 0.56 inches. Movement arc slots 32, 34, and 36 are cut by laser procedures through the disk 30 at three locations which are on a 0.372 inch radius from center. The arc slots 32, 34, and 36 are cut on a 65° arc and are separated by a 55° arc. The slots 32, 34, and 36 have a preferred width of 0.01 inches. The movement arc slots 32, 34, and 36 allow bidirectional movement of a center section 31 when the hydrophone is confronted with impinging acoustic energy. If a hydrophone, comprised of two piezoelectric cylinders bonded together with a ceramic substrate disk, were not permitted to move in the center, the receive patterns would not be evenly omnidirectional. This degradation in sensitivity is avoided by allowing the center section 31 to move with the acoustic elements.

Figure 5:
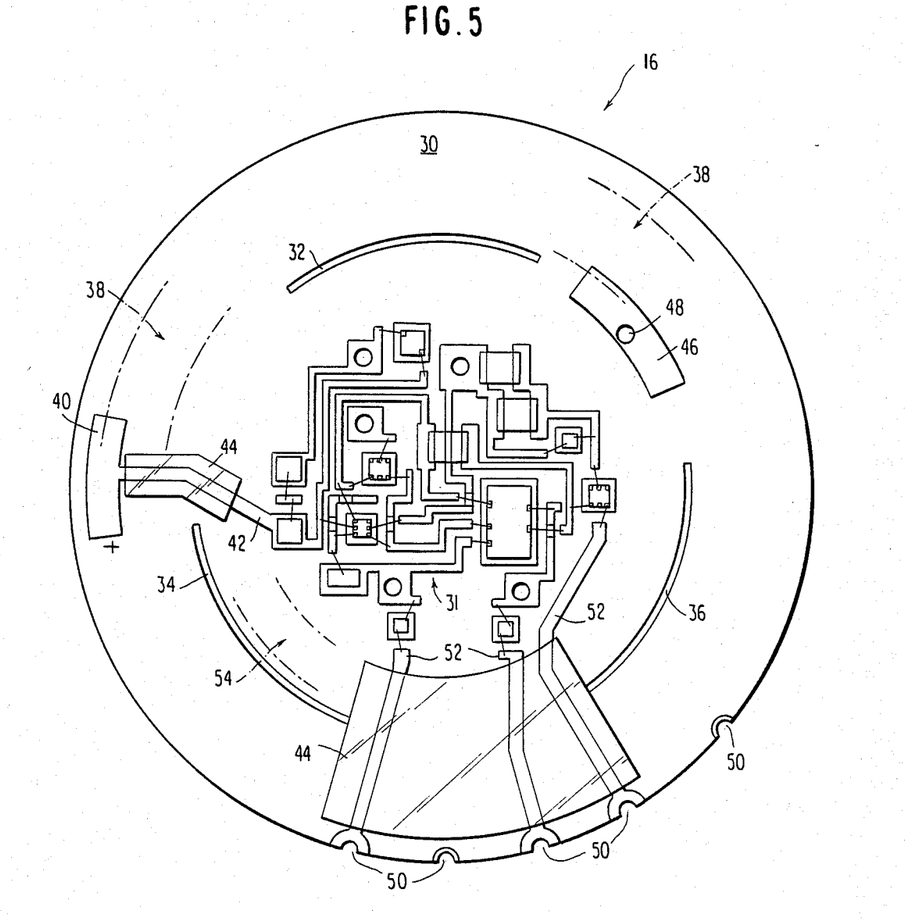
FIG. 5 is a plan view of a first side of the hybrid circuit substrate showing the relative positions of the micro-electronic circuitry, the thick film conductive lines, and the mounting sites for a piezoelectric element and a protective cap.
Figure 7:
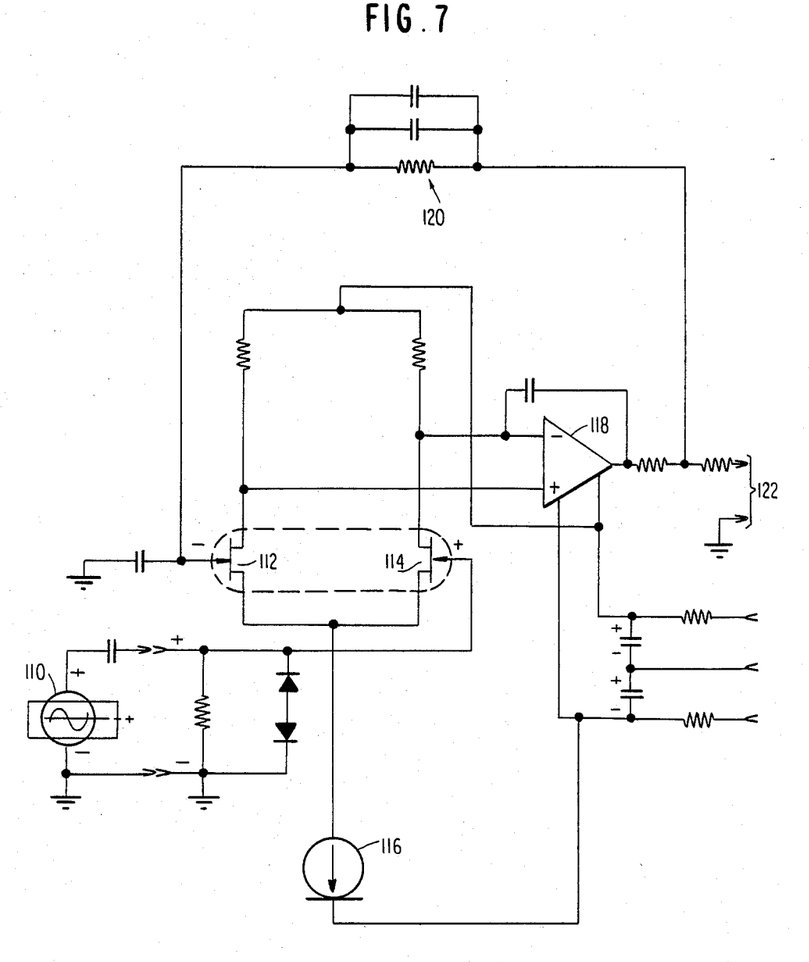
FIG. 7 is a circuit diagram showing the circuitry used in a hydrophone device which has been constructed and tested.

FIG. 5 shows a first side of the hybrid circuit substrate 16. Micro-electronic circuitry, shown generally in the center section 31 of the ceramic disk 30, is formed on the ceramic disk 30 using standard thick film and thin film technologies. In a hydrophone which has been constructed, the self noise of the amplifier was kept low by using thin film resistors, very small thick film circuitry, and low noise amplifier chips wire bonded to the thick film circuitry. FIG. 7 shows a circuit diagram of circuitry which may be used in the invention. A piezo sensor 110, corresponding to cylindrical elements 12 and 14, is connected to a differential amplifier comprising a pair of field effect transistors (FETs) 112 and 114 connected to a common current source 116. The source electrodes of the FETs 112 and 114 are respectively connected to positive and negative inputs of a high gain amplifier 118 provided with capacitive feedback to provide low pass filtering of the amplified signal. The output of amplifier 118 is fedback via an RC circuit 120 having a defined transfer characteristic to the gate electrode of the reference FET 112 of the differential amplifier. This circuit provides a highly sensitive, low noise output on terminals 122 of the signal generated by the piezo sensor 110.

The circuitry used may vary depending on the device being constructed, i.e., receiver or projector, and the tolerances which are required. The nature of the microelectronic circuitry is not specifically important to this invention; however, the packaging concept which allows for some data processing capability at the hydrophone level that is above and beyond mere pre-amplification is believed to be novel. Processing at the hydrophone eliminates noise problems encountered when sensed information must be transmitted to the surface for processing. The sensed information can be processed by the hydrophone circuitry and the resulting data can then be transmitted over wire or fiber optic cable with less errors. The microelectronic circuitry covers an area of roughly 0.55 inches in diameter.

In the preferred configuration, a piezoelectric cylinder which is positively poled on its outside surface and negatively poled on its inside surface is attached to the first side of the hybrid circuit substrate 16. Region 38 on disk 30 shows that base of the cylinder will be positioned outside the movement arc slots 32, 34, and 36, and inside the diameter of the disk 30. An outer cylinder surface contact pad 40 is bonded to the base of the cylinder towards the outside surface of the cylinder using a silver epoxy or solder paste. A conductive line 42, which extends between slots 32 and 34, connects the outer cylinder surface contact pad 40 to the microelectronic circuitry fabricated in the center area 31. Glass dielectric 44 is coated over the conductive line 42 in order to insulate conductive line 44 from the piezoelectric cylinder thereby preventing electrical contact with both the positive poled and negative poled surfaces of the piezoelectric cylinder. An inner cylinder surface contact pad 46 is bonded to the base of the cylinder towards the inside surface with the same bonding materials used to bond the outer cylinder surface contact pad 40. A through hole 48 which extends through disk 30 is provided in the inner cylinder surface contact pad 46. Through hole 48 permits the interconnection of the negatively poled inner surface of the piezoelectric cylinder mounted on side 1 of disk 30 with the positively poled inner surface of the piezoelectric cylinder mounted on side 2. Disk 30 also includes other through holes in the center section 31 which permit the interconnection of the micro-electronic circuitry on side 1 with the micro-electronic circuitry on side 2.

Five solder pad notches 50 appear on a perimeter edge of the alumina ceramic disk 30. The notches 50 allow the acoustic element assembly, which comprises the hybrid circuit substrate 16 and the piezoelectric cylinders bonded thereto, to be connected to input/output cables. The cable connections are believed to be standard and are, therefore, not part of the invention. The conductive lines 52, which allow electrical connections between three of the cable notches 50 and the microelectronic circuitry in the center section 31 of the disk 30, are coated with an insulating glass dielectric material 44 that prevents any electrical contact with the piezoelectric cylinders from occurring.

The base of the piezoelectric cylinder is firmly secured to the alumina ceramic disk 30 by a non-conductive epoxy having a matching thermal coefficient of expansion which is applied in region 38 in all areas except at the contact pads 40 and 46. Region 38 completely encircles the center section 31 of the disk 30. Hence, the piezoelectric cylinder is connected to the alumina ceramic disk 30 by both conductive and non-conductive materials. Region 54, which is located inside the diameter of the movement arc slots 32, 34, and 36 and outside the micro-electronic circuitry in the center section 31, indicates the position where a protective ceramic pressure cover will be bonded. If piezoelectric hemispheres are used instead of piezoelectric cylinders, the ceramic protective cover will not be required. Region 54 completely encircles the micro-electronic circuitry. The pressure cover is preferably bonded to disk 30 with an epoxy having a thermal coefficient of expansion matched to that of the alumina ceramic.

Figure 6:
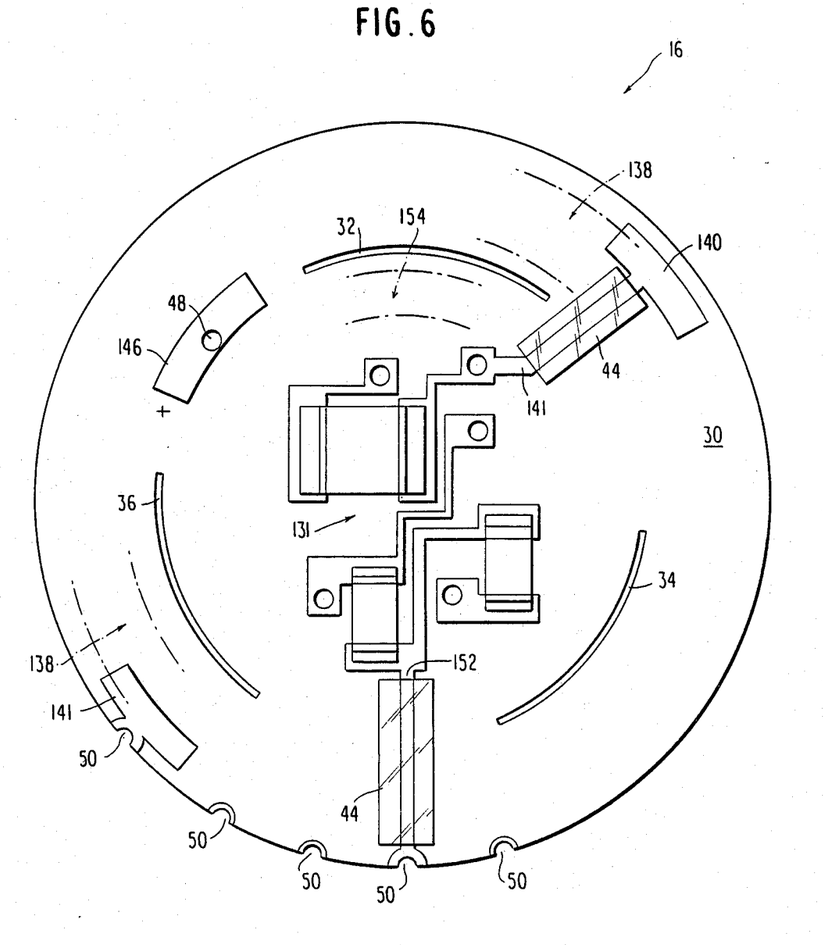
FIG. 6 is a plan view of a second side of the hybrid circuit substrate showing the relative positions of the micro-electronic circuitry, the thick film conductive lines, and the mounting sites for a piezoelectric element and a protective cap.

FIG. 6 shows the second side of the hybrid circuit substrate 16. Side two has many of the same features as side one. Micro-electronic circuitry is fabricated in a center section 131 of the alumina ceramic disk 30 using thick and thin film techniques. Region 138 indicates the position where a piezoelectric ceramic cylinder which is poled positive on the inside surface and poled negative on the outside surface will be bonded to disk 30. An inner surface bonding pad 146 and an outer surface bonding pad 140 are bonded to the base of the piezoelectric cylinder towards the respective poled surfaces of the cylinder using silver epoxy or solder paste. In addition, outer surface bonding pad 141 positioned at a notch 50 is bonded to the bottom surface of the cylinder towards the negatively poled outer surface. As indicated above, through hole 48 interconnects the positive poled surface of the cylinder on side two with the negative poled surface of the cylinder on side 1. Conductive line 141 connected to the outer surface bonding pad 140 and conductive line 152 connected to input/output cabling secured to notch 50 are both coated with a glass dielectric 44 which insulates conductive lines 141 and 152 from electrical contact with the piezoelectric cylinder. A ceramic pressure cover is secured over the micro-electronic circuitry in the center section 131 by an epoxy material bonding the cover to the disk 30 at region 154.

All internal wiring to acoustic elements has been eliminated in the inventive hydrophone packaging design. The piezoelectric elements are bonded directly on thick film connective circuitry instead of wire bonding. The hydrophone design is readily adaptable to automated processing. Laser cutting, thick and thin film fabrication, dielectric coating, and joining the piezoelectric elements to the hybrid circuit disk can be done as separate automatic processing steps. The unit produced is the acoustic element assembly of a hydrophone. To be a completed hydrophone the assembly must be placed in a protective cover and input/output cables must be connected. The assembly does not require additional structural support. It can simply be potted in plastic or suspended in an oil filled boot. Automated processing permits several thousand hydrophones to be produced at relatively low cost.

Figure 8:
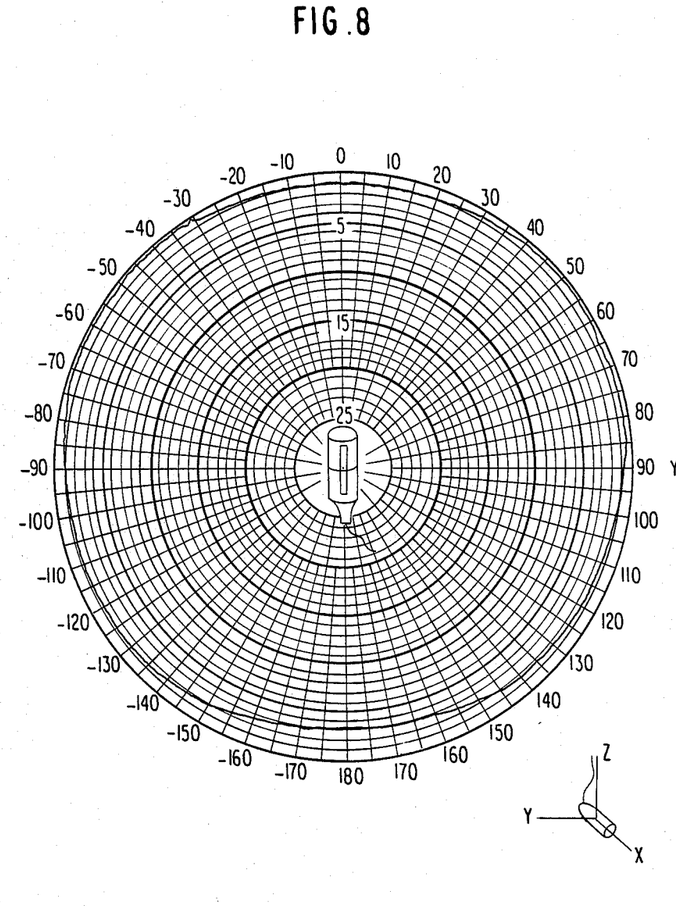
FIG. 8 is a polar plot showing the test results of the hydrophone which has been constructed.

FIG. 8 is a polar plot showing the high quality acoustic reception found in a hydrophone constructed according to the invention. The receive beam pattern is evenly omnidirectional with the only degradation resulting from the cable exiting out the back side.

While the invention has been described in terms of specifically shaped components which are made of certain materials and bonded together by other specific materials, other shapes and materials can be used within the spirit and scope of the appended claims.

Having thus described my invention, what I claim as novel and desire to secure by letters patent is the following;

1. An acoustic element assembly for an acoustic transducer, comprising:
    a substrate;
    micro-electronic circuitry formed in a center section of said substrate and being integral therewith;
    bidirectional movement means for permitting bidirectional movement of said center section of said substrate;
    two piezoelectric ceramic elements, each of said elements having a positively poled surface and a negatively poled surface, said elements being bonded to opposite sides of said substrate with a non-conductive material;
    contact pads formed on opposite sides of said substrate, said piezoelectric ceramic elements being electrically connected to said contact pads with a conductive bonding material; and
    conductive lines formed on opposite sides of said substrate for electrically connecting said piezoelectric ceramic elements to said micro-electronic circuitry.

2. An acoustic element assembly as recited in claim 1 wherein said bidirectional movement means comprises slots cut through said substrate, said slots positioned around the periphery of said micro-electronic circuitry, said slots permitting bidirectional movement of said center section of said substrate.

3. An acoustic element assembly as recited in claim 1, further comprising a glass dielectric coated over said conductive lines, said glass dielectric insulating said conductive lines from said piezoelectric ceramic elements.

4. An acoustic element assembly as recited in claim 1 wherein said contact pads are comprised of two groups, a first group of contact pads consisting of pads which are electrically connected to said positively poled surface of said piezoelectric ceramic elements, a second group of contact pads consisting of pads which are electrically connected to said negatively poled surface of said piezoelectric ceramic elements.

5. An acoustic assembly as recited in claim 4 further comprising a means for interconnecting a first contact pad selected from said first group of contact pads with a second contact pad selected from said second group of contact pads.

6. An acoustic element assembly as recited in claim 1 wherein said piezoelectric elements are hemispherically shaped.

7. An acoustic element assembly as recited in claim 1 wherein said piezoelectric elements are cylindrically shaped.

8. An acoustic element assembly as recited in claim 7 further comprising a protective cover positioned over said micro-electronic circuitry formed in said center section of said substrate.

9. An acoustic element assembly as recited in claim 1 wherein said substrate comprises an alumina ceramic disk.

10. An acoustic element assembly for an acoustic transducer, comprising:
    a disk shaped substrate with slots cut therethrough at a selected radial distance;
    micro-electronic circuitry formed on first and second sides of said substrate in a center section, said micro-electronic circuitry being integral with said substrate, said center section being positioned inside said selected radial distance;
    two hollow piezoelectric ceramic cylinders having larger inside diameters than said selected radial distance, a first of said cylinders having a positively poled outside surface and a negatively poled inside surface, a second of said cylinders having a positively poled inside surface and a negatively poled outside surface, said first cylinder being bonded with a non-conductive material to said first side of said substrate, said second cylinder being bonded with said nonconductive material to said second side of said substrate;
    contact pads formed on said first and second sides of said substrate, said first and second cylinders being electrically connected to said contact pads with a conductive bonding material;
    conductive lines formed on said first and second sides of said substrate for electrically connecting said first and second cylinders to said micro-electronic circuitry; and
    protective covers for protecting said microelectronic circuitry, said covers bonded to said first and second sides of said substrate, said protective covers having a diameter smaller than said selected radial distance.

11. An acoustic element assembly as recited in claim 10 wherein said substrate is comprised of alumina ceramic.

12. An acoustic element assembly as recited in claim 10 further comprising a glass dielectric coated over said conductive lines, said glass dielectric insulating said conductive lines from said first and second piezoelectric cylinders.

13. An acoustic element assembly as recited in claim 10 wherein said contact pads are comprised of two groups, a first group of contact pads consisting of pads which are electrically connected to said outside surfaces of said first and second cylinders, a second group of contact pads consisting of pads which are electrically connected to said inside surfaces of said first and second cylinders.

14. An acoustic element assembly as recited in claim 13 further comprising a means for interconnecting said second group of contact pads.

15. An automated method for manufacturing an acoustic element assembly for a hydrophone, comprising the steps of:

cutting slots in a circular disk, said slots being a selected radial distance from the center of said circular disk;

fabricating micro-electronic circuitry on a first and second side of said disk, said microelectronic circuitry being fabricated inside said selected radial distance;

forming contact pads at a position outside said selected radial distance, a first pair of said contact pads being connected to said micro-electronic circuitry by conductive lines formed on said disk, said first pair of contact pads being positioned on opposite sides of said disk, a second pair of said contact pads being electrically interconnected, said second pair of contact pads being positioned on opposite sides of said disk; and bonding a pair of piezoelectric elements on opposite sides of said disk, said elements being bonded to said disk at a position outside said selected radial distance, said elements being bonded to said contact pads with a conductive bonding material and being bonded to bare portions of said disk with a non-conductive bonding material.

* * * * *